(12) United States Patent
Chiang et al.

(10) Patent No.: US 10,862,516 B1
(45) Date of Patent: Dec. 8, 2020

(54) DIGITAL PRE-DISTORTION CIRCUIT AND DIGITAL PRE-DISTORTION METHOD

(71) Applicant: Sercomm Corporation, Taipei (TW)

(72) Inventors: Kun-Lin Chiang, Taipei (TW); Jia-Ming Chen, Taipei (TW)

(73) Assignee: Sercomm Corporation, Taipei (TW)

( * ) Notice: Subject to any disclaimer, the term of this patent is extended or adjusted under 35 U.S.C. 154(b) by 0 days.

(21) Appl. No.: 16/579,884

(22) Filed: Sep. 24, 2019

(30) Foreign Application Priority Data

Aug. 30, 2019 (TW) .............................. 108131161 A

(51) Int. Cl.
*H04B 1/04* (2006.01)
*H03F 1/32* (2006.01)
*H03F 3/24* (2006.01)

(52) U.S. Cl.
CPC ............. *H04B 1/04* (2013.01); *H03F 1/3247* (2013.01); *H03F 3/24* (2013.01); *H03F 2200/129* (2013.01); *H03F 2200/171* (2013.01); *H03F 2200/451* (2013.01); *H03F 2201/3215* (2013.01); *H03F 2201/3233* (2013.01); *H04B 2001/0408* (2013.01); *H04B 2001/0425* (2013.01)

(58) Field of Classification Search
USPC ................................. 375/296, 297; 702/117
See application file for complete search history.

(56) References Cited

U.S. PATENT DOCUMENTS

| 9,184,710 | B2 | 11/2015 | Braithwaite |
| 10,218,392 | B2 | 2/2019 | Kim et al. |
| 10,256,853 | B2 | 4/2019 | Kim et al. |
| 2003/0058959 | A1* | 3/2003 | Rafie ..................... H03F 1/3247 375/296 |

(Continued)

FOREIGN PATENT DOCUMENTS

| CN | 102969987 | 3/2013 |
| CN | 104320095 | 1/2015 |

(Continued)

OTHER PUBLICATIONS

"Office Action of Taiwan Counterpart Application," dated Jan. 22, 2020, p. 1-p. 5.

*Primary Examiner* — Eva Y Puente
(74) *Attorney, Agent, or Firm* — JCIPRNET

(57) ABSTRACT

A digital pre-distortion circuit and a digital pre-distortion method are provided. In the method, pre-distortion, digital-to-analog conversion and an amplifying process are performed on an input signal in sequence, to generate an output signal. A first bandwidth of the input signal after the pre-distortion is greater than a second bandwidth of the input signal after the digital-to-analog conversion. Signals outside the second bandwidth are filtered out from the output signal, to generate a second output signal. A third output signal, which is a signal after a pre-distorted signal is amplified, is estimated according to the pre-distorted signal and the second output signal. The pre-distorted signal is a signal after the pre-distortion is performed on the input signal. A third bandwidth of the third output signal is greater than the (Continued)

second bandwidth. Parameters of the pre-distortion can be determined according to the third output signal and the pre-distorted signal.

8 Claims, 5 Drawing Sheets

(56) References Cited

U.S. PATENT DOCUMENTS

| | | | | |
|---|---|---|---|---|
| 2010/0056082 A1* | 3/2010 | Chiu | ............... | H03F 1/3247 |
| | | | | 455/114.3 |
| 2013/0173203 A1* | 7/2013 | Palaskas | ......... | G01R 31/31813 |
| | | | | 702/117 |
| 2014/0050282 A1* | 2/2014 | Watanabe | ............ | H03F 1/3247 |
| | | | | 375/296 |
| 2014/0233677 A1* | 8/2014 | Zhang | ................ | H04L 25/06 |
| | | | | 375/297 |
| 2018/0034491 A1* | 2/2018 | Plevel | ............... | H04L 27/366 |
| 2018/0115288 A1* | 4/2018 | Konno | ................ | H03F 3/21 |
| 2020/0052659 A1* | 2/2020 | Kim | ................. | H04L 43/028 |

FOREIGN PATENT DOCUMENTS

| | | |
|---|---|---|
| CN | 105119578 | 12/2015 |
| CN | 108604884 | 9/2018 |
| CN | 109643974 | 4/2019 |
| TW | I304679 | 12/2008 |
| TW | I516019 | 1/2016 |

* cited by examiner

DIGITAL PRE-DISTORTION CIRCUIT AND DIGITAL PRE-DISTORTION METHOD

CROSS-REFERENCE TO RELATED APPLICATION

This application claims the priority benefit of Taiwan application serial no. 108131161, filed on Aug. 30, 2019. The entirety of the above-mentioned patent application is hereby incorporated by reference herein and made a part of this specification.

BACKGROUND

1. Technical Field

The disclosure relates to a signal processing technique, and in particular, to a digital pre-distortion circuit and a digital pre-distortion (DPD) method.

2. Description of Related Art

The watt level of a signal affects the performance and throughput of a communication system, so a power amplifier (PA) plays an indispensable role in the communication system. The power amplifier has non-linear characteristics, so that when it operates in a high power range, distortion phenomena such as spectral re-growth, adjacent channel interference, out-of-band emissions and in-band distortion will be caused. In order to avoid the foregoing distortion phenomena, a digital pre-distortion technique has been provided. The digital pre-distortion technique may perform signal training on output and input signals of the power amplifier and accordingly form a compensation signal to perform pre-distortion on the input signal through the compensation signal.

FIG. 1 is a flow chart of digital pre-distortion, and FIG. 2 is a conventional circuit applying digital pre-distortion. Referring to FIG. 1 and FIG. 2 at the same time, after a spectrum 201 of an original transmitted signal is processed through the PA, there is a leakage phenomenon, which will cause the quality of the transmitted signal to be reduced, and further affect signals of adjacent bands to cause inter-band interference. In order to suppress the foregoing phenomena, a signal x(n) is fed back to a receiving end (i.e., an output signal is obtained through a feedback path) through a coupler after being processed by a digital-to-analog converter (DAC) and the PA, and the fed signal y(n) enters a DPD training device after being processed by an analog-to-digital converter (ADC). Furthermore, a coefficient obtained by the DPD training device will be transmitted to a DPD actuator for use. The DPD training device may find a coefficient corresponding to a minimum error e(n) between a signal z(n) of the signal x(n) after the pre-distortion and a trained signal $\hat{z}(n)$.

It is worth noting that the DPD technique may correct signals within a bandwidth of the DAC, but is unable to correct signals outside the bandwidth of the DAC. As shown in FIG. 2, if the bandwidth of the spectrum 201 of the signal is 100 megahertz (MHz), an adjacent channel leakage ratio (ACLR) in 5 times of the bandwidth of the signal rises after the signal passes through the PA (a spectrum 203 has a bandwidth of 500 MHz). When the DAC and the ADC have sufficient bandwidths (for example, the bandwidth is 500 MHz), the problem of the adjacent channel leakage ratio may be corrected by the DPD actuator (a pre-distorted spectrum 202 has a bandwidth of 500 MHz), and the signal may be restored to the original transmitted signal (the spectrum 201 as in FIG. 2 is approximately the same as the spectrum 203 (amplitude increased)). However, when the DAC and the ADC have bandwidths that are less than 5 times, the DPD actuator may only correct the partial problem of the adjacent channel leakage ratio. Thus, the digital pre-distortion technique for limited bandwidths still needs to be improved.

SUMMARY

In view of this, the embodiments of the disclosure provide a digital pre-distortion circuit and a digital pre-distortion method. Under a condition of a limited bandwidth, a pre-distortion model is trained based on an estimated output signal with a relatively large bandwidth to solve the problem caused by less bandwidth.

A digital pre-distortion method according to an embodiment of the disclosure includes the following steps: performing pre-distortion, digital-to-analog conversion and an amplifying process on an input signal in sequence to generate an output signal, where a first bandwidth of the input signal after the pre-distortion is greater than a second bandwidth of the input signal after the digital-to-analog conversion; filtering out a signal outside the second bandwidth from the output signal to generate a second output signal; estimating a third output signal, which is a signal after a pre-distorted signal is amplified, according to the pre-distorted signal and the second output signal, where the pre-distorted signal is a signal after the pre-distortion is performed on the input signal, and a third bandwidth of the third output signal is greater than the second bandwidth; and determining a parameter of the pre-distortion according to the third output signal and the pre-distorted signal.

A digital pre-distortion circuit according to an embodiment of the disclosure includes a pre-distorter, a digital-to-analog converter, an amplifying circuit, a band-pass filter, and an output signal estimation circuit. The pre-distorter performs pre-distortion on an input signal to generate a pre-distorted signal. The pre-distorted signal has a first bandwidth. The digital-to-analog converter is coupled to the pre-distorter, and converts the pre-distorted signal into an analog pre-distorted signal. The analog pre-distorted signal has a second bandwidth, and the first bandwidth is greater than the second bandwidth. The amplifying circuit is coupled to the digital-to-analog converter, and amplifies the analog pre-distorted signal to generate an output signal. The band-pass filter is coupled to the amplifying circuit, and filters out a signal outside the second bandwidth from the output signal to generate a second output signal. The output signal estimation circuit is coupled to the band-pass filter and the pre-distorter, and estimates a third output signal, which is a signal after the pre-distorted signal is amplified by the amplifying circuit, according to the pre-distorted signal and the second output signal. A third bandwidth of the third output signal is greater than the second bandwidth, and the pre-distorter determines a parameter of the pre-distortion according to the third output signal and the pre-distorted signal.

Based on the above, for the digital-to-analog converter having a bandwidth less than the bandwidth processed by the amplifying circuit, the digital pre-distortion circuit and the digital pre-distortion method of the embodiments of the disclosure filter out the signals outside the bandwidth of the digital-to-analog converter from the output signal, and then accordingly estimate an output signal having a larger bandwidth. This output signal will be used for pre-distortion training. Therefore, parameters obtained by the training may further correct distortions beyond the bandwidth of the digital-to-analog converter, so as to overcome the defects of an insufficient bandwidth.

In order to make the aforementioned and other objectives and advantages of the disclosure comprehensible, embodiments accompanied with figures are described in detail below.

DESCRIPTION OF THE EMBODIMENTS

Figure 1:
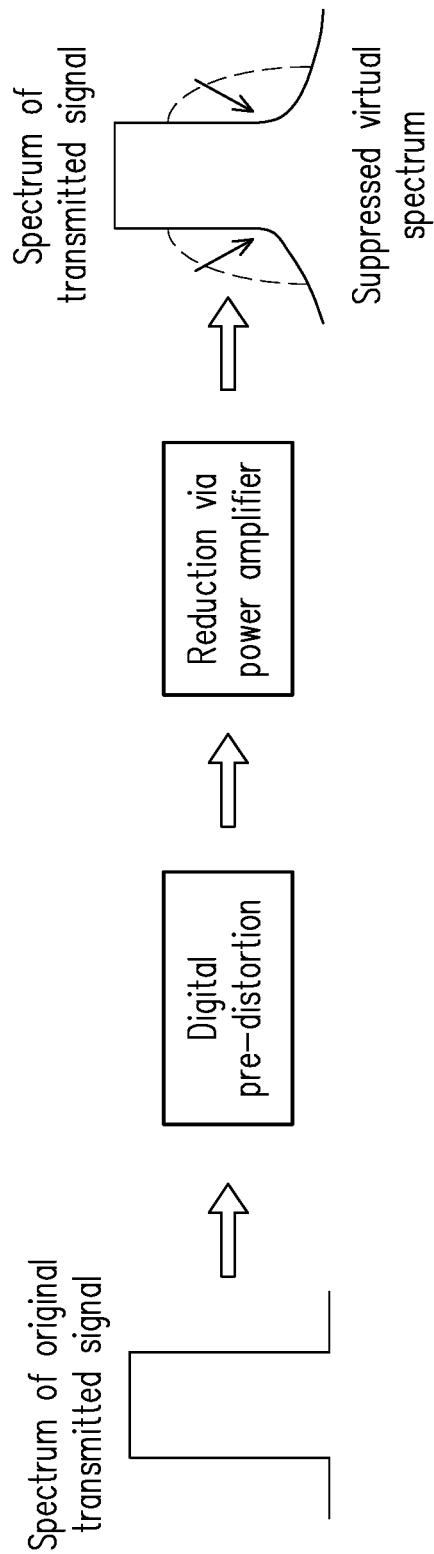
FIG. 1 is a flow chart of digital pre-distortion.
Figure 2:
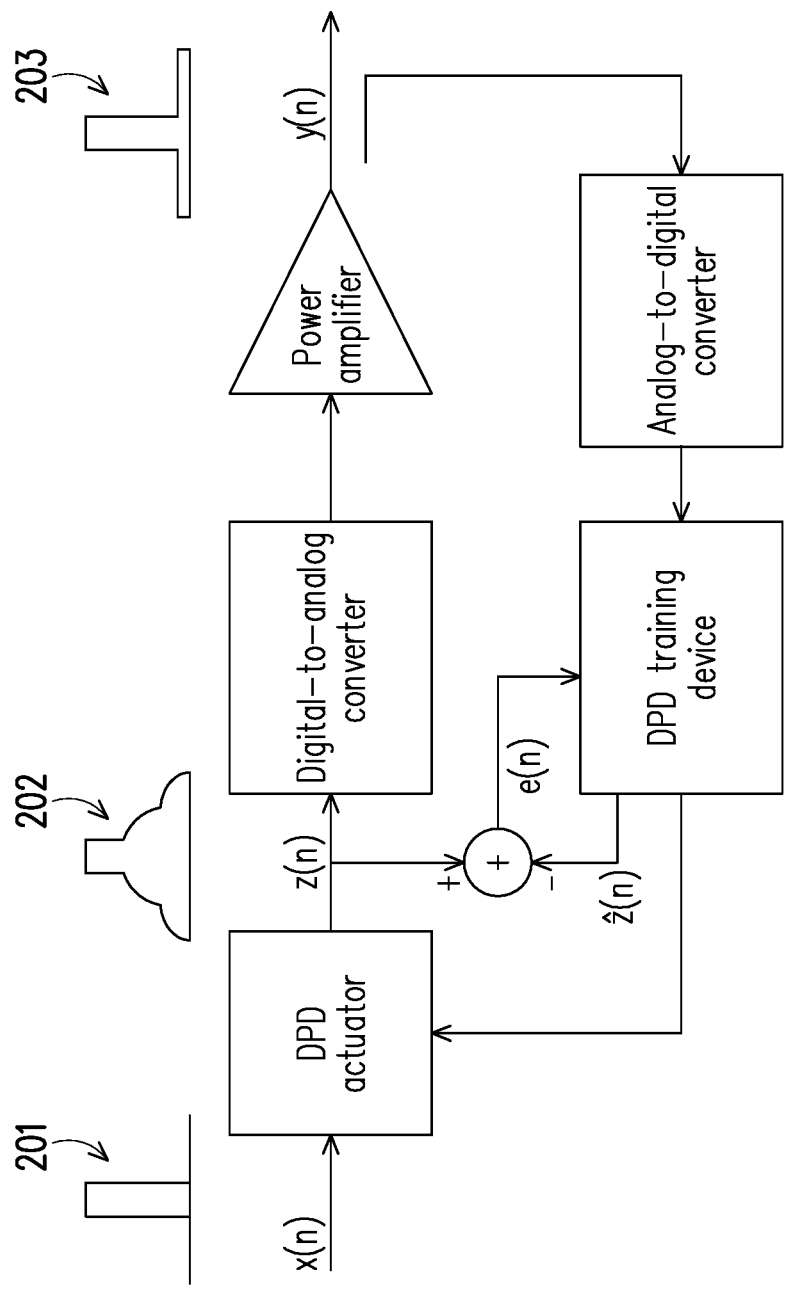
FIG. 2 is a conventional circuit applying digital pre-distortion.
Figure 3:
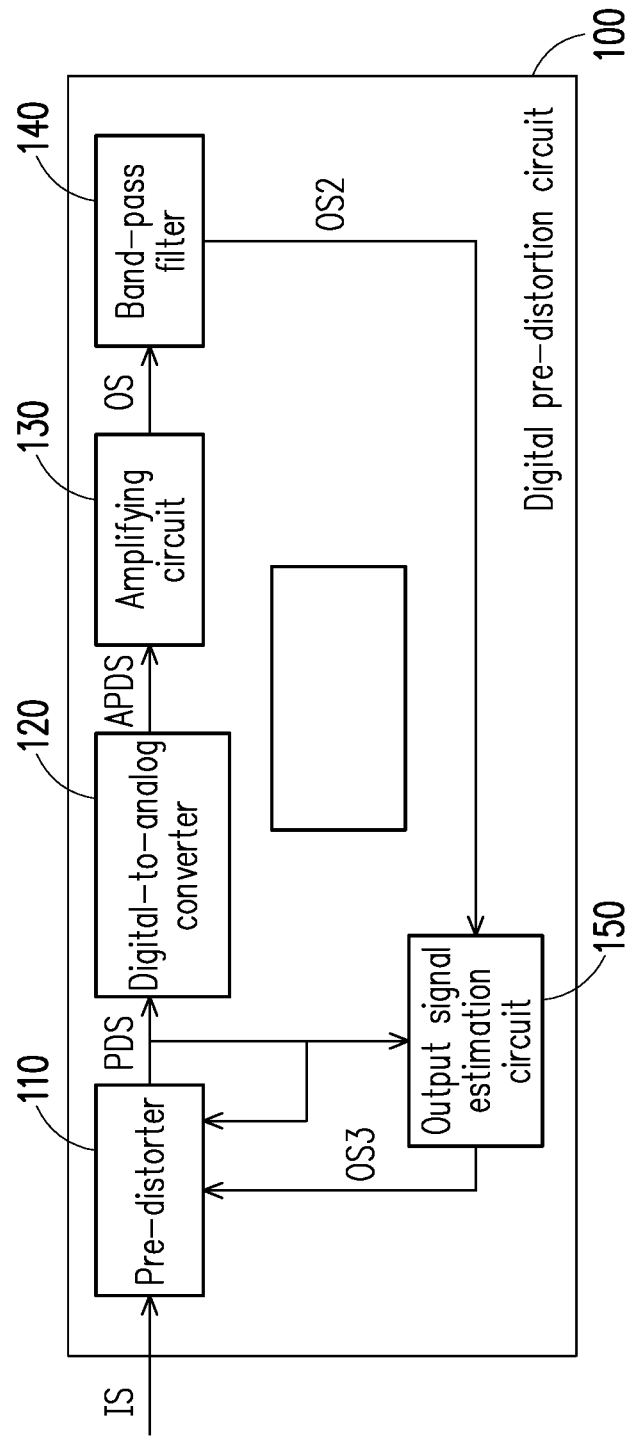
FIG. 3 is an element block diagram of a digital pre-distortion circuit according to one embodiment of the disclosure.

FIG. 3 is a block diagram of elements of a digital pre-distortion circuit 100 according to one embodiment of the disclosure. Referring to FIG. 3, the digital pre-distortion circuit 100 includes, but not limited to, a pre-distorter 110, a digital-to-analog converter 120, an amplifying circuit 130, a band-pass filter 140, and an output signal estimation circuit 150. The digital pre-distortion circuit 100 may be embedded in various types of base stations, user equipment (such as mobile phones, tablet computers and the like), communication transceivers (such as supporting Wi-Fi, or various generations of mobile communication technologies), or other communication transceiving devices.

The pre-distorter 110 receives a digital-form input signal IS, and is configured to perform pre-distortion on the input signal IS to generate a pre-distorted signal PDS, and has detailed functions described in detail in the following embodiments. The pre-distorter 110 may be implemented by a programmable unit such as a digital signal processor (DSP), a microprocessor, an application-specific integrated circuit (ASIC), a field programmable gate array (FPGA), or the like.

The digital-to-analog converter 120 is coupled to the pre-distorter 110, and is configured to perform digital-to-analog conversion on the pre-distorted signal PDS to generate an analog pre-distorted signal APDS (i.e., an analog-form pre-distorted signal PDS). It is worth noting that in the embodiment of the disclosure, a first bandwidth of the input signal IS after the pre-distortion is greater than a second bandwidth of the input signal IS after the digital-to-analog conversion (i.e., the digital-to-analog converter 120 has the second bandwidth). For example, the first bandwidth is 500 MHz, and the second bandwidth is 300 MHz.

The amplifying circuit 130 is coupled to the digital-to-analog converter 120, and is configured to amplify the analog pre-distorted signal to generate an output signal OS. The amplifying circuit 130 may be a power amplifier used to adjust a power gain of the analog pre-distorted signal APDS. It should be noted that in some embodiments, a mixer may be further connected between the amplifying circuit 130 and the digital-to-analog converter 120 to form the output signal OS with a radio frequency.

The band-pass filter 140 is coupled to the amplifying circuit 130, and is configured to filter out signals outside a specific band from the output signal OS to generate a second output signal OS2. The second output signal OS2 may be further sent out through an antenna and/or other transmitters. It should be noted that in some embodiments, a coupler may be further connected between the band-pass filter 140 and the amplifying circuit 130 to feed back the output signal OS to a receiving end (i.e., the digital pre-distortion circuit 100).

The output signal estimation circuit 150 is coupled to the band-pass filter 140 and the pre-distorter 110 and is configured to receive the pre-distorted signal PDS and the second output signal OS2 and accordingly generate a third output signal OS3, and has detailed functions described in detail in the following embodiments. The output signal estimation circuit 150 may be implemented by a programmable unit such as a digital signal processor, a microprocessor, an application-specific integrated circuit, a field programmable gate array or the like, or may be a circuit composed of a plurality of digital circuits.

In order to facilitate the understanding of the operation flow of the embodiment of the disclosure, a signal processing flow for the digital pre-distortion circuit 100 in the embodiment of the disclosure will be described in detail below in conjunction with multiple embodiments. Hereinafter, the method of the embodiment of the disclosure will be described in conjunction with various elements and modules in the digital pre-distortion circuit 100. The various processes of the method may be adjusted according to implementation situations, and are not limited thereto.

Figure 4:
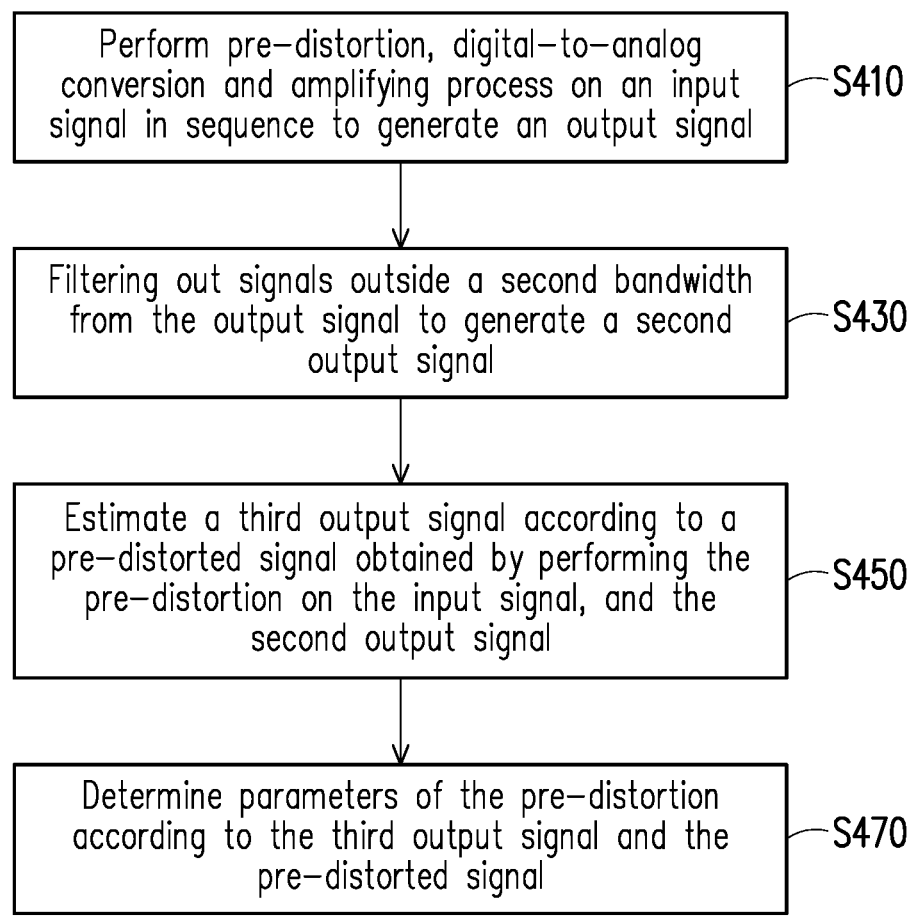
FIG. 4 is a flow chart of a digital pre-distortion method according to one embodiment of the disclosure.

FIG. 4 is a flow chart of a digital pre-distortion method according to one embodiment of the disclosure. Referring to FIG. 4, a digital pre-distortion circuit 100 performs pre-distortion, digital-to-analog conversion and an amplifying process on an input signal in sequence to generate an output signal (Step S410). Specifically, a pre-distorter 110 may use a Wiener-Hammerstein model, a memory polynomial (MP) model, a generalized memory polynomial (GMP) model, or other memory power amplifier models to perform the pre-distortion. For example, a mathematic expression of the MP model is expressed as follows:

$$y_{MP}(n) = \sum_{k=1} \sum_{q=0} c_{kq} x(n-q) |x(n-q)|^{k-1} \quad (1)$$

$y_{MP}(n)$ is an output signal (i.e., a pre-distorted signal PDS) of the pre-distorter 110; x(n) is an input signal (i.e., the input signal IS) of the pre-distorter 110; $c_{kq}$ is a coefficient; and n is an integer. For another example, a mathematic expression of the generalized memory polynomial model is expressed as follows:

$$y_{GMP}(n) = \sum_{k=1} \sum_{Q=0} a_{kq} x(n-q)|x(n-q)|^{k-1}$$
$$+ \sum_{k=2} \sum_{Q=0} \sum_{l=1} b_{kql} x(n-q)|x(n-q-l)|^{k-1}$$
$$+ \sum_{k=2} \sum_{Q=0} \sum_{l=1} c_{kql} x(n-q)|x(n-q+l)|^{k-1} \quad (2)$$

$y_{GMP}(n)$ is an output signal (i.e., the pre-distorted signal PDS) of the pre-distorter 110; x(n) is an input signal (i.e., the input signal IS) of the pre-distorter 110; and $a_{kq}$, $b_{kql}$ and $c_{kql}$ are coefficients. These coefficients in functions used in the pre-distortion are parameters obtained by training of the pre-distorter 110 based on a third output signal OS3 and the pre-distorted signal PDS (such as coefficients of a pre-distortion model or other gain functions). For example, the pre-distorter 110 minimizes an error between signals after the pre-distorted signal PDS and the third output signal OS3 are processed by an inverse model/function (i.e., the pre-distortion model) of an amplifying circuit 130, and an inverse model with a minimum error is obtained. The pre-distorter 110 may compensate for the distortion phenomena of the amplifying circuit 130 outside the bandwidth of the input signal IS based on these parameters.

It should be noted that the pre-distorter 110 of the embodiment of the disclosure includes a training function (for example, training the coefficients of the pre-distortion model or the gain function), and a correcting function (for example, passing the input signal IS through the memory power amplifier model or multiplying it with the gain function). In addition, the foregoing pre-distortion uses an adaptive algorithm, but in some embodiments, the pre-distorter 110 may also use a lookup table mode (such as, linear correspondence or gain correspondence) to obtain the pre-distorted signal PDS.

It is worth noting that the embodiment of the disclosure is directed to a limitation that the second bandwidth of the digital-to-analog converter 120 is less than the first bandwidth of the pre-distorted signal PDS. That is, the second bandwidth of an analog pre-distorted signal APDS is less than the first bandwidth of the pre-distorted signal PDS. However, the output signal OS generated by amplifying the analog pre-distorted signal APDS by the amplifying circuit 130 may have a distortion phenomenon (e.g., leakage, spectral re-growth or the like) outside the second bandwidth. If the pre-distorter 110 trains the parameters used in the pre-distortion based on the output signal OS and the pre-distorted signal PDS, these parameters may only compensate for distortion phenomena within the second bandwidth. In order to solve the foregoing problem, the embodiment of the disclosure may further process the output signal OS.

The band-pass filter 140 filters out signals outside the second bandwidth from the output signal OS to generate a second output signal OS2 (step S430). For example, the second bandwidth is 200 MHz, and the second output signal OS2 is a signal retained in the output signal OS within 200 MHz. Therefore, the distortion, outside the second bandwidth, of the output signal OS generated by the amplifying circuit 130 may be ensured to be removed.

Then, an output signal estimation circuit 150 estimates the third output signal OS3 according to the pre-distorted signal PDS that is a signal after the pre-distortion is performed on the input signal IS and the second output signal OS2 (Step S450). Specifically, since the second bandwidth is less than a bandwidth amplified by the amplifying circuit 130, the pre-distortion trained based on the output signal OS may be unable to correct the signal, outside the second bandwidth, in the output signal OS. The embodiment of the disclosure generates the third output signal OS3 having a bandwidth greater than the second bandwidth at first. The output signal estimation circuit 150 may estimate an analog amplifying circuit corresponding to the amplifying circuit 130. This analog amplifying circuit may be in a form of function or comparison table. A signal after the pre-distorted signal PDS is processed by the analog amplifying circuit tends to be the third output signal OS3 in the second bandwidth. For example, the output signal estimation circuit 150 minimizes an error between the signal after the pre-distorted signal PDS is processed by the analog amplifying circuit 130 and the second output signal OS2, and obtains a function of the analog amplifying circuit with a minimum error. The output signal estimation circuit 150 then takes the signal generated by amplifying the pre-distorted signal PDS by the analog amplifying circuit as the third output signal OS3. The third output signal OS3 is generated by assuming that the pre-distorted signal PDS is not subjected to the digital-to-analog conversion with the limited bandwidth, and a third bandwidth of the third output signal OS3 will be greater than the second bandwidth. The third bandwidth may be equal to the first bandwidth or another bandwidth greater than the second bandwidth.

Next, the pre-distorter 110 determines parameters of the pre-distortion according to the third output signal OS3 and the pre-distorted signal PDS (Step S470). Specifically, compared with the output signal OS, the third output signal OS3 is not limited by the bandwidth of the digital-to-analog conversion. Therefore, the pre-distorter 110 may correct the signal outside the second bandwidth based on the parameters (such as coefficients of the pre-distortion model or other gain functions) obtained by the training of the third output signal OS3. The pre-distortion model of a memory power amplifier is taken as an example, and an mathematic expression of the memory polynomial model with the limited bandwidth is expressed as follows:

$$y_{MP,L}(n) = \Sigma_m h_m y_{MP}(n-m)$$

$$= \Sigma_{k=1} \Sigma_{Q=0} \Sigma_m h_m c_{kq} x(n-q-m) |x(n-q-m)|^{k-1}$$

$$= \Sigma_{k=1} \Sigma_{Q=0} c_{kq} \Sigma_m h_m x(n-q-m) |x(n-q-m)|^{k-1}$$

$$= \Sigma_{k=1} \Sigma_{Q=0} c_{kq} x_L(n-q-m) \quad (3)$$

$y_{MP,L}(n)$ is an output signal of the pre-distorter 110 (i.e., the pre-distorted signal PDS), and $h_m$ is a frequency response of low pass filtering (the bandwidth thereof is not greater than the bandwidth (i.e., the second bandwidth) of the band-pass filter 140). In a passband of the low pass filtering, the pre-distorter 110 may solve the error (i.e., obtain a coefficient) between the signals after the pre-distorted signal PDS and the third output signal OS3 are processed by the inverse model/function (i.e., the pre-distortion model) of the amplifying circuit 130 by an optimal mode such as least square (LS), mean square (MS), root mean square (RMS) or the like, and a mathematic expression is expressed as follows:

$$y_{MP,L} = X_{MP,L} c_{PA, BL} \quad (4)$$

$y_{MP,L}$ is an output signal (i.e., the pre-distorted signal PDS) of the pre-distorter 110; $X_{MP,L}$ is an input signal (i.e., the input signal IS) of the pre-distorter 110; and $c_{PA, BL}$ is a full-bandwidth coefficient (having a corresponding bandwidth greater than the second bandwidth).

For another example, a mathematic expression of the generalized memory polynomial model with the limited bandwidth is expressed as follows:

$$y_{GMP,L}(n) = \Sigma_m h_m y_{GMP}(n-m)$$

$$= \Sigma_{k=1} \Sigma_{q=0} a_{kq} \Sigma_m h_m x(n-q-m) |x(n-q-m)|^{k-1}$$

$$+ \Sigma_{k=1} \Sigma_{q=0} \Sigma_{l=1} b_{kql} \Sigma_m h_m x(n-q-m) |x(n-q-l-m)|^{k-1}$$

$$+ \Sigma_{k=1} \Sigma_{q=0} \Sigma_{l=1} c_{kql} \Sigma_m h_m x(n-q-m) |x(n-q+l-m)|^{k-1} \quad (5)$$

$y_{GMP,L}(n)$ is an output signal (i.e., the pre-distorted signal PDS) of the pre-distorter 110. In the same way, the pre-distorter 110 may also solve the mathematic expression (5) by an optimal mode, such as least square, mean square, root mean square or the like. Then, the pre-distorter 110 may perform the pre-distortion on the input signal IS based on the parameters obtained by the training of the third output signal OS3. Therefore, the distortion phenomenon, outside the second bandwidth, of the output signal OS may be corrected.

Figure 5:
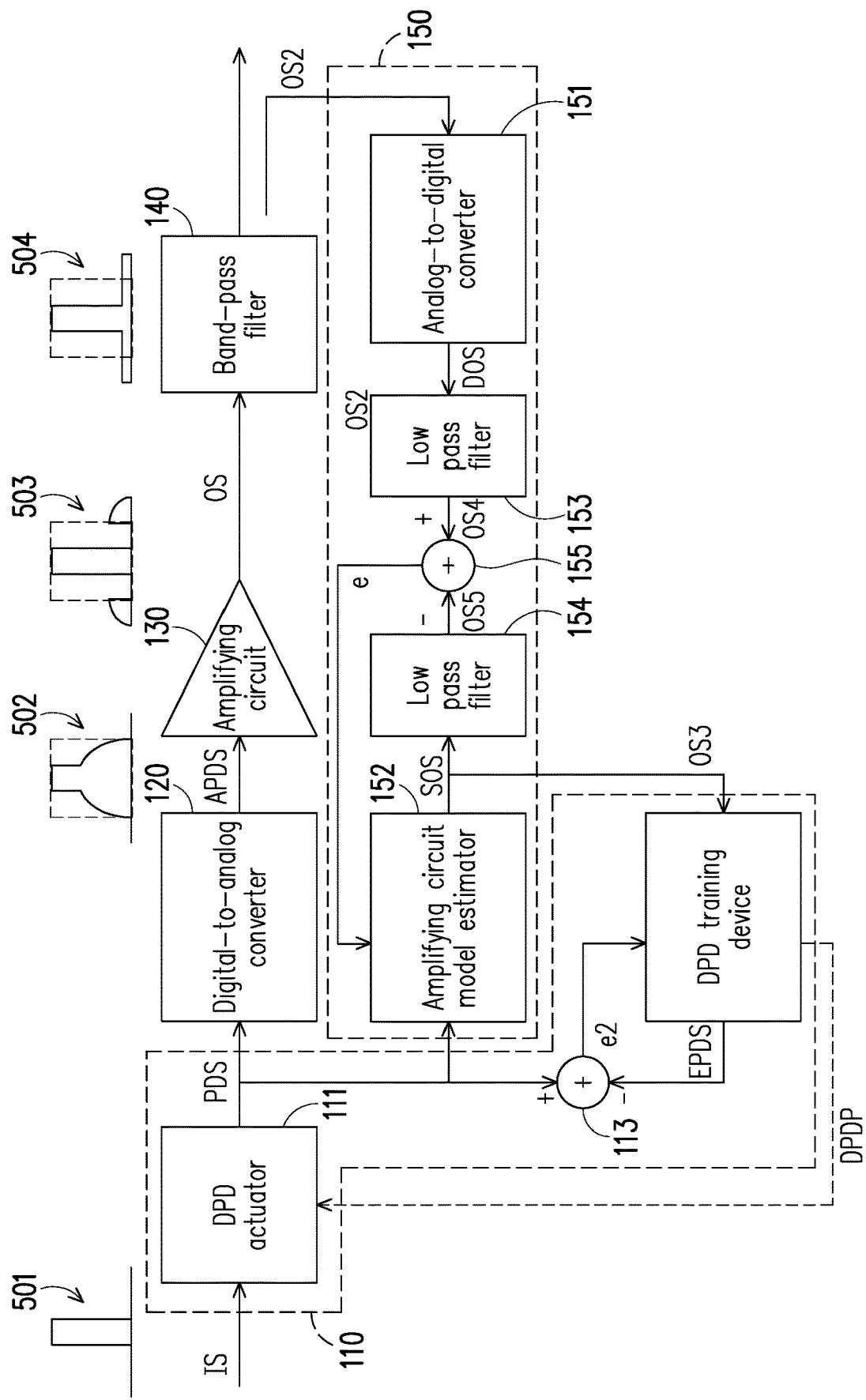
FIG. 5 illustrates an element block diagram and a spectrum diagram of a digital pre-distortion circuit according to one embodiment of the disclosure.

Description is made below by more specific hardware structures. FIG. 5 illustrates an element block diagram and a spectrum diagram of a digital pre-distortion circuit 100 according to one embodiment of the disclosure. Referring to FIG. 5, the pre-distorter 110 includes a DPD actuator 111, a DPD training device 112 and a summation circuit 113. The output signal estimation circuit 150 includes an analog-to-digital converter (ADC) 151, an amplifying circuit model estimator 152, low pass filters 153 and 154, and a summation circuit 155.

The DPD actuator 111 and the DPD training device 112 are respectively configured to perform the correcting and training functions of the pre-distorter 110 described above. The low pass filters 153 and 154 are filters with known frequency responses and bandwidths not greater than the bandwidth (i.e., the second bandwidth) of the band-pass filter 140. The amplifying circuit model estimator 152 may be implemented by a programmable unit such as a digital signal processor, a microprocessor, an application-specific integrated circuit and a field programmable gate array.

The input signal IS is processed by the digital-to-analog converter 120, the amplifying circuit 130 and the band-pass filter 140 in sequence to generate the second output signal OS2. The analog-to-digital converter 151 converts the second output signal OS2 into a digital output signal DOS in a digital form, and the low pass filter 153 performs low pass filtering on the digital output signal DOS to generate a fourth output signal OS4. On another aspect, the amplifying circuit model estimator 152 generates an initial analog amplifying circuit, and amplifies the pre-distorted signal PDS through the analog amplifying circuit to generate a simulated output signal SOS. The low pass filter 154 performs low pass filtering on the simulated output signal SOS to generate a fifth output signal OS5. The summation circuit 155 subtracts the fourth output signal OS4 from the fifth output signal OS5 to obtain an error e between the two output signals OS4 and OS5. The error e may be used to estimate a final analog amplifying circuit. The amplifying circuit model estimator 152 may minimize the error e to obtain an analog amplifying circuit with the minimum error e. Then, the amplifying circuit model estimator 152 will use the analog amplifying circuit with the minimum error e to amplify the pre-distorted signal PDS to form the third output signal OS3.

The DPD training device 112 is based on the initial pre-distortion model, and processes the third output signal OS3 through the pre-distortion model to generate an estimated pre-distorted signal EPDS. The summation circuit 113 subtracts the estimated pre-distorted signal EPDS from the pre-distorted signal PDS to obtain an error e2 between the two signals EPDS and PDS. This error e2 may be used to generate a final pre-distortion model. The DPD training device 112 may minimize the error e2 to obtain a pre-distortion model with the minimum error e2. Then, the DPD training device 112 generates a parameter DPDP used in the pre-distortion according to the pre-distortion model with the minimum error for the DPD actuator 111 to use.

For a spectral variation, after a spectrum 501 of the input signal IS is subjected to the pre-distortion by the DPD actuator 111, its bandwidth may be increased, but the digital-to-analog converter 120 may only form the analog pre-distorted signal APDS (the spectrum thereof is as shown in the figure, and a spectrum 502 is limited by the second bandwidth in a dotted box) having the second bandwidth. The bandwidth of the output signal OS after the analog pre-distorted signal APDS is amplified by the amplifying circuit 130 may possibly exceed the second bandwidth (the spectrum thereof is as shown in the figure, and a spectrum 503 still has a frequency response outside the second bandwidth (expressed by the dotted box)). The band-pass filter 140 removes the signals outside the second bandwidth to output the second output signal OS2 (the spectrum thereof is as shown in the figure, and frequency responses, outside the second bandwidth, in the spectrum 504 compared with the spectrum 503 are filtered out).

It should be noted that the shapes of the spectrums 501 to 504 are only to describe the examples, and are not configured to limit the types or parameters of the input signal IS, the digital-to-analog converter 120, the amplifying circuit 130 and the band-pass filter 140.

Based on the above, the digital pre-distortion circuit and the digital pre-distortion method of the embodiments of the disclosure estimate an output signal having a larger bandwidth under the limitation that the bandwidth of the digital-to-analog converter is less than the bandwidth processed by the amplifying circuit, and train the parameters used in the pre-distortion through the output signal. In addition, signals, outside the bandwidth of the digital-to-analog converter, in the output signal processed by the amplifying circuit will be filtered out. Therefore, the distortion outside the bandwidth of the digital-to-analog converter may be corrected, so as to compensate the defect of less bandwidth.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A digital pre-distortion method, comprising:
performing pre-distortion, digital-to-analog conversion and an amplifying process on an input signal in sequence to generate an output signal, wherein a first bandwidth of the input signal after the pre-distortion is greater than a second bandwidth of the input signal after the digital-to-analog conversion;
filtering out a signal outside the second bandwidth from the output signal to generate a second output signal;
estimating a third output signal, which is a signal after a pre-distorted signal is amplified, according to the pre-distorted signal and the second output signal, wherein the pre-distorted signal is a signal after the pre-distortion is performed on the input signal, a third bandwidth of the third output signal is greater than the second bandwidth, and estimating the third output signal comprises:
converting the second output signal into a digital output signal; and
estimating an analog amplifying circuit corresponding to an amplifying circuit of the amplifying process according to the pre-distorted signal and the digital output signal, wherein
the third output signal is generated by amplifying the pre-distorted signal by the analog amplifying circuit; and
determining a parameter of the pre-distortion according to the third output signal and the pre-distorted signal.

2. The digital pre-distortion method according to claim 1, wherein estimating the analog amplifying circuit corresponding to the amplifying circuit comprises:
performing low pass filtering on the digital output signal to generate a fourth output signal;
performing the low pass filtering on the third output signal to generate a fifth output signal, wherein a bandwidth corresponding to the low pass filtering is not greater than the second bandwidth; and generating the analog amplifying circuit according to an error between the fourth output signal and the fifth output signal.

3. The digital pre-distortion method according to claim 2, wherein generating the analog amplifying circuit comprises:
minimizing the error to obtain the analog amplifying circuit with a minimum error.

4. The digital pre-distortion method according to claim 1, wherein the third bandwidth is equal to the first bandwidth.

5. A digital pre-distortion circuit, comprising:
a pre-distorter, performing pre-distortion on an input signal to generate a pre-distorted signal, wherein the pre-distorted signal comprises a first bandwidth;
a digital-to-analog converter, coupled to the pre-distorter, and converting the pre-distorted signal into an analog pre-distorted signal, wherein the analog pre-distorted signal comprises a second bandwidth, and the first bandwidth is greater than the second bandwidth;
an amplifying circuit, coupled to the digital-to-analog converter, and amplifying the analog pre-distorted signal to generate an output signal;
a band-pass filter, coupled to the amplifying circuit, and filtering out a signal outside the second bandwidth from the output signal to generate a second output signal; and
an output signal estimation circuit, coupled to the band-pass filter and the pre-distorter, and estimating a third output signal, which is a signal after the pre-distorted signal is processed by the amplifying circuit, according to the pre-distorted signal and the second output signal, wherein a third bandwidth of the third output signal is greater than the second bandwidth, the pre-distorter determines a parameter of the pre-distortion according to the third output signal and the pre-distorted signal, and the the output signal estimation circuit comprises:
an analog-to-digital converter, coupled to the band-pass filter, and converting the second output signal into a digital output signal; and
an amplifying circuit model estimator, coupled to the analog-to-digital converter and the pre-distorter, and estimating an analog amplifying circuit corresponding to the amplifying circuit according to the pre-distorted signal and the digital output signal, wherein the third output signal is generated by amplifying the pre-distorted signal by the analog amplifying circuit.

6. The digital pre-distortion circuit according to claim 5, wherein the output signal estimation circuit further comprises:
a first low pass filter, coupled to the analog-to-digital converter, and filtering the digital output signal to generate a fourth output signal; and
a second low pass filter, coupled to the amplifying circuit model estimator, and filtering the third output signal to generate a fifth output signal, wherein bandwidths corresponding to the first low pass filter and the second low pass filter are not greater than the second bandwidth, wherein
the amplifying circuit model estimator generates the analog amplifying circuit according to an error between the fourth output signal and the fifth output signal.

7. The digital pre-distortion circuit according to claim 6, wherein the amplifying circuit model estimator minimizes the error to obtain the analog amplifying circuit with a minimum error.

8. The digital pre-distortion circuit according to claim 5, wherein the third bandwidth is equal to the first bandwidth.

* * * * *